(12) United States Patent
McKnight et al.

(10) Patent No.: US 10,998,372 B1
(45) Date of Patent: May 4, 2021

(54) HYBRID FOCAL-PLANE ARRAY AND METHOD OF MANUFACTURING THE SAME

(71) Applicant: HRL LABORATORIES, LLC, Malibu, CA (US)

(72) Inventors: Geoffrey P. McKnight, Los Angeles, CA (US); Andrew C. Keefe, Encino, CA (US); Alexander R. Gurga, Canoga Park, CA (US); Ryan Freeman, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 202 days.

(21) Appl. No.: 16/388,044

(22) Filed: Apr. 18, 2019

Related U.S. Application Data

(60) Provisional application No. 62/688,162, filed on Jun. 21, 2018.

(51) Int. Cl.
*H01L 27/146* (2006.01)

(52) U.S. Cl.
CPC .... *H01L 27/1469* (2013.01); *H01L 27/14634* (2013.01); *H01L 27/14687* (2013.01)

(58) Field of Classification Search
CPC .............. H01L 27/1469; H01L 27/146; H01L 27/14601; H01L 27/14634; H01L 27/14683; H01L 27/14687
See application file for complete search history.

(56) References Cited

U.S. PATENT DOCUMENTS

| | | | |
|---|---|---|---|
| 6,828,545 B1 * | 12/2004 | Hamilton, Jr. ...... | H01L 27/1465 250/214.1 |
| 10,062,727 B2 * | 8/2018 | McKnight ............. | G06T 3/4007 |
| 10,748,957 B1 * | 8/2020 | McKnight ............... | G06F 30/23 |
| 2006/0181627 A1 * | 8/2006 | Farrier ............... | H04N 5/35545 348/308 |
| 2008/0151084 A1 * | 6/2008 | Lu ..................... | H01L 27/14601 348/294 |
| 2008/0151089 A1 * | 6/2008 | Street .................... | H04N 5/335 348/308 |

* cited by examiner

*Primary Examiner* — John R Lee
(74) *Attorney, Agent, or Firm* — Lewis Roca Rothgerber Christie, LLP

(57) ABSTRACT

A method of manufacturing a hybrid focal-plane array includes: forming a read-out integrated circuit with integral bending slit; forming a detector die separately from the read-out integrated circuit and including a detector with integral bending slit; and joining the read-out integrated circuit and the detector die to each other such that the read-out bending slit and the detector bending slit are aligned with each other.

20 Claims, 4 Drawing Sheets

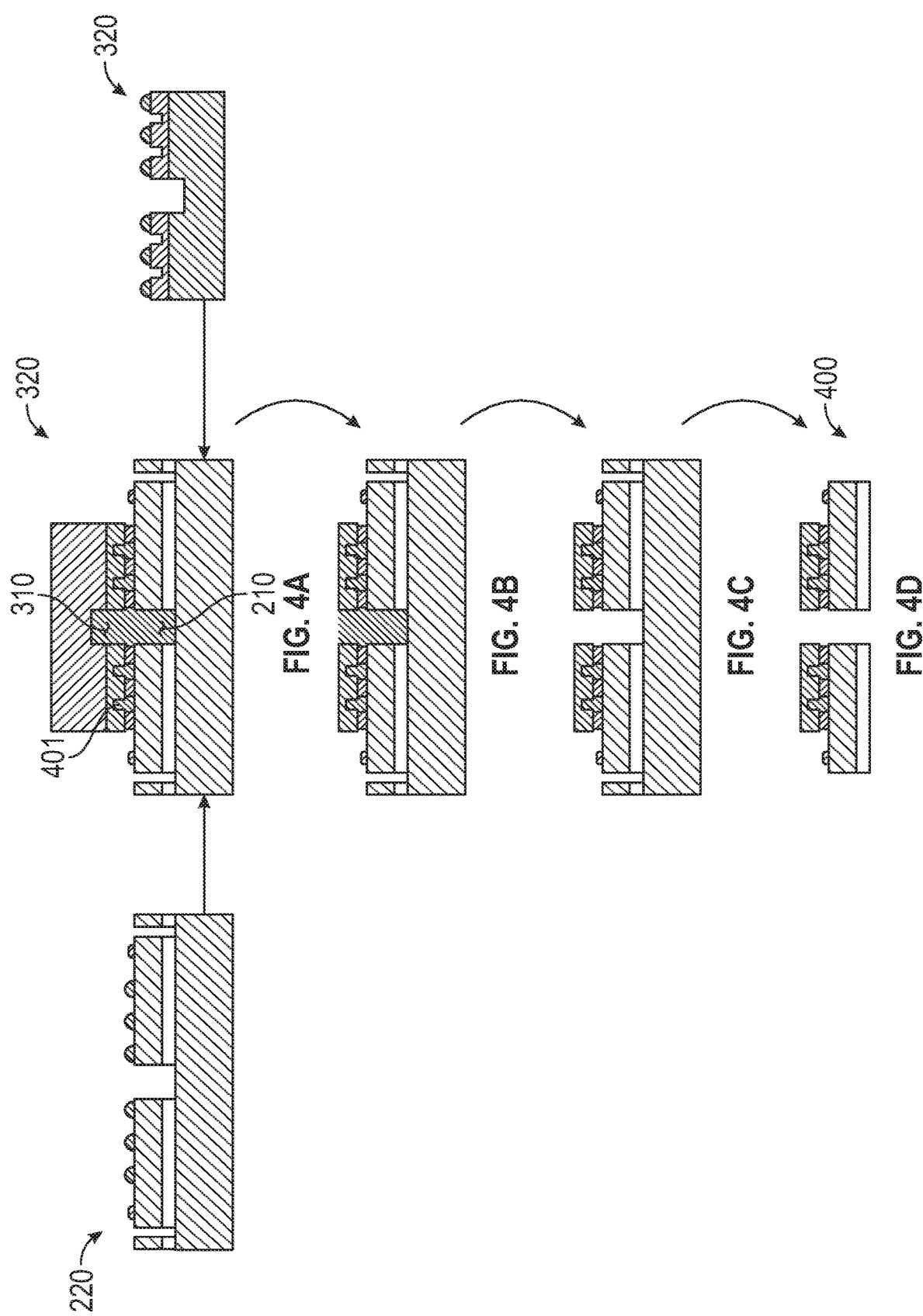

HYBRID FOCAL-PLANE ARRAY AND METHOD OF MANUFACTURING THE SAME

CROSS-REFERENCE TO RELATED APPLICATION

The present application claims priority to and the benefit of U.S. Provisional Patent Application Ser. No. 62/688,162, filed on Jun. 21, 2018, the entire content of which is incorporated herein by reference.

STATEMENT REGARDING FEDERALLY SPONSORED RESEARCH OR DEVELOPMENT

This invention was made with U.S. Government support under Contract No. 2017-17033000004 awarded by the Intelligence Advanced Research Projects Activity (IARPA). The U.S. Government has certain rights to this invention.

BACKGROUND

1. Field

Aspects of embodiments of the present disclosure relate to a hybrid focal-plane array (FPA) and a method of manufacturing the same. Additional aspects of embodiments of the present disclosure relate to an infrared (IR) sensing hybrid focal-plane array (FPA) and a method of manufacturing the same.

2. Description of Related Art

Focal-plane arrays (FPAs) are used in imaging devices and generally include an array of light-sensing pixels arranged at the focal plane of an optical lens. FPAs may be complementary metal-oxide-semiconductor (CMOS) sensors and/or charge-coupled device (CCD) sensors for imaging systems (e.g., cameras) and/or light detection and ranging (LIDAR) systems. CMOS and CCD sensors are well-suited to detecting light in the visible spectrum but are lackluster at detecting light in the infrared spectrum.

Research has recently been conducted into curved semiconductors, including curved FPAs for use in imaging devices. Compared to related art flat FPAs, curved FPAs, when used in imaging devices, allow for a wider range of optical lens designs and are able to acquire sharper, more detailed images and may operate at lower light levels, thereby extending the operational window (e.g., the operational parameters) when compared to the related art flat FPAs. Imaging devices using curved FPAs, due at least in part to the potential to increase the numerical aperture of the optical lens, gather more illumination intensity on the FPA and, accordingly, may also be capable of acquiring images at a higher frame rate and with less noise than related art imaging devices using flat FPAs. Imaging devices used curved FPAs may be used in, as a few examples, surveillance systems, such as high-powered cameras and/or satellite-based imaging systems, and autonomous devices, such as autonomous vehicles and/or drones.

One type of curved FPA includes a mosaic of flat or substantially flat individual FPAs stitched together on a curved die, but this approach requires high detail to the alignment between the different FPAs and is susceptible to misalignment over time and/or at excessive temperatures. Another type of curved FPA includes a related art flat FPA that is mechanically curved. This approach often results in the curved FPA creeping back to toward its flat state over time, and the maximum achievable curvature is limited because the FPA may crease or wrinkle when excessively curved.

SUMMARY

Aspects of embodiments of the present disclosure are directed toward a hybrid focal-plane array (FPA) and a method of manufacturing the same. The hybrid focal-plane array may be an imaging sensor, such as an optical imaging sensor or an infrared imaging sensor. The hybrid focal-plane array may include one or more internal slits therein along with substantially defect free edges, allowing the hybrid focal-plane array to be spherically curved to a greater degree than related art focal-plane arrays. The hybrid focal-plane array may include a read-out integrated circuit and a detector die, which may be substantially manufactured separately from each other and then joined together for final processing. After being joined together, both upper and lower surfaces of the hybrid focal-plane array may be lapped and/or etched to reduce the overall thickness of the hybrid focal-plane array. Further, the edges of the hybrid focal-plane array are etched to produce nearly defect free edges. Together, the reduced, uniform thickness, the nearly defect free edges of the hybrid focal-plane array, and the internal slit(s) allow the hybrid focal-plane array to be spherically curved to a greater degree than related art focal-plane arrays without suffering cracking, wrinkling, or misalignment issues.

According to an embodiment of the present disclosure, a method of manufacturing a hybrid focal-plane array includes: forming a read-out integrated circuit with integral bending slit; forming a detector die separately from the read-out integrated circuit and including a detector with integral bending slit; and joining the read-out integrated circuit and the detector die to each other such that the read-out bending slit and the detector bending slit are aligned with each other.

The forming of the read-out integrated circuit may include etching a read-out slit pattern into a device layer of a silicon-on-insulator wafer. The read-out slit pattern may include the read-out bending slit.

The etching of the read-out slit pattern may include deep reactive-ion etching.

The forming of the read-out integrated circuit may further include saw cutting a bulk wafer of the silicon-on-insulator wafer after the etching of the read-out slit pattern.

The forming of the detector die may include etching a detector slit pattern into a detector layer thereof. The detector slit pattern may include the detector bending slit.

The detector layer may include an epitaxially-grown layer, the detector slit pattern may be formed in the epitaxially-grown layer, and the detector bending slit of the detector slit pattern may extend through the epitaxially-grown layer and a plurality of pixel definition slits of the detector slit pattern may have a depth less than a thickness of the epitaxially-grown layer.

The joining of the read-out integrated circuit and the detector die to each other may include: aligning the read-out integrated circuit and the detector die with each other; adhered the read-out integrated circuit and the detector die to each other using a flip-chip bonding method; and under-filling a space between the read-out integrated circuit and the detector die with an adhesive.

The method may further include: removing a detector substrate from the detector die after the joining of the read-out integrated circuit and the detector die to each other;

and removing a bulk wafer from the read-out integrated circuit after the joining of the read-out integrated circuit and the detector die to each other.

The removing of the detector substrate may reveal the detector bending slit.

The method may further include removing a portion of the adhesive in the read-out bending slit and the detector bending slit after the removing of the detector substrate.

According to an embodiment of the present disclosure, a method of manufacturing a hybrid focal-plane array including a read-out integrated circuit and a detector die includes: forming the read-out integrated circuit, the forming of the read-out integrated circuit including forming a read-out bending slit extending through a device layer and an insulation layer of a silicon-on-insulator wafer; forming the detector die, the forming of the detector die including forming a detector bending slit extending through a detector layer and into a detector substrate; aligning the read-out integrated circuit and the detector die with each other such that the read-out bending slit and the detector bending slit are aligned with each other; and adhering the read-out integrated circuit and the detector die to each other.

The forming of the read-out integrated circuit may further include forming a plurality of bumps on the device layer; and the forming of the detector die may further include forming a plurality of bumps on the detector layer.

The forming of the detector die may further include forming a plurality of pixel definition slits in the detector layer. The pixel definition slits may have a depth less than a thickness of the detector layer, and the bumps on the detector layer may be formed between adjacent ones of the pixel definition slits.

The forming of the read-out integrated circuit may further include etching an edge of the device layer; and the forming of the detector die may further include etching an edge of the detector layer.

The forming of the read-out integrated circuit may further include saw cutting an edge of a bulk wafer of the silicon-on-insulator wafer; and the forming of the detector die may further include saw cutting an edge of the detector substrate.

After the adhering of the read-out integrated circuit and the detector die to each other, the detector substrate may be removed from the detector die.

The read-out integrated circuit and the detector die may be adhered to each other with an adhesive, and after the removal of the detector substrate from the detector die, an adhesive in the read-out bending slit and the detector bending slit may be removed.

After the adhering of the read-out integrated circuit and the detector die to each other, a bulk wafer of the silicon-on-insulator wafer may be removed.

After the removal of the detector substrate and the bulk wafer, the read-out bending slit and the detector bending slit may form a continuous slit extending through the detector die and the read-out integrated circuit.

According to an embodiment of the present disclosure, a hybrid focal-plane array includes: a read-out integrated circuit including a device layer and having a read-out bending slit extending through the device layer; and a detector die including a detector layer and having a detector bending slit extending through the detector layer. The read-out integrated circuit and the detector die are adhered to each other such that the read-out bending slit and the detector bending slit are aligned with each other.

BRIEF DESCRIPTION OF THE DRAWINGS

These and other aspects and features of the present disclosure will be further appreciated and better understood with reference to the specification, claims, and appended drawings, in which:

FIGS. 4A-4D show schematic acts (steps) of joining the ROIC and the detector die to each other to form a hybrid focal-plane array.

DETAILED DESCRIPTION

The detailed description set forth below in connection with the appended drawings is intended as a description of example embodiments of the present disclosure and is not intended to represent the only forms in which the present disclosure may be embodied. The description sets forth aspects and features of the present disclosure in connection with the illustrated embodiments. It is to be understood, however, that the same or equivalent aspects and features may be accomplished by different embodiments, and such other embodiments are encompassed within the spirit and scope of the present disclosure. As noted elsewhere herein, like element numbers in the description and the drawings are intended to indicate like elements. Further, descriptions of features, configurations, and/or other aspects within each embodiment should typically be considered as available for other similar features, configurations, and/or aspects in other embodiments.

Figure 1:
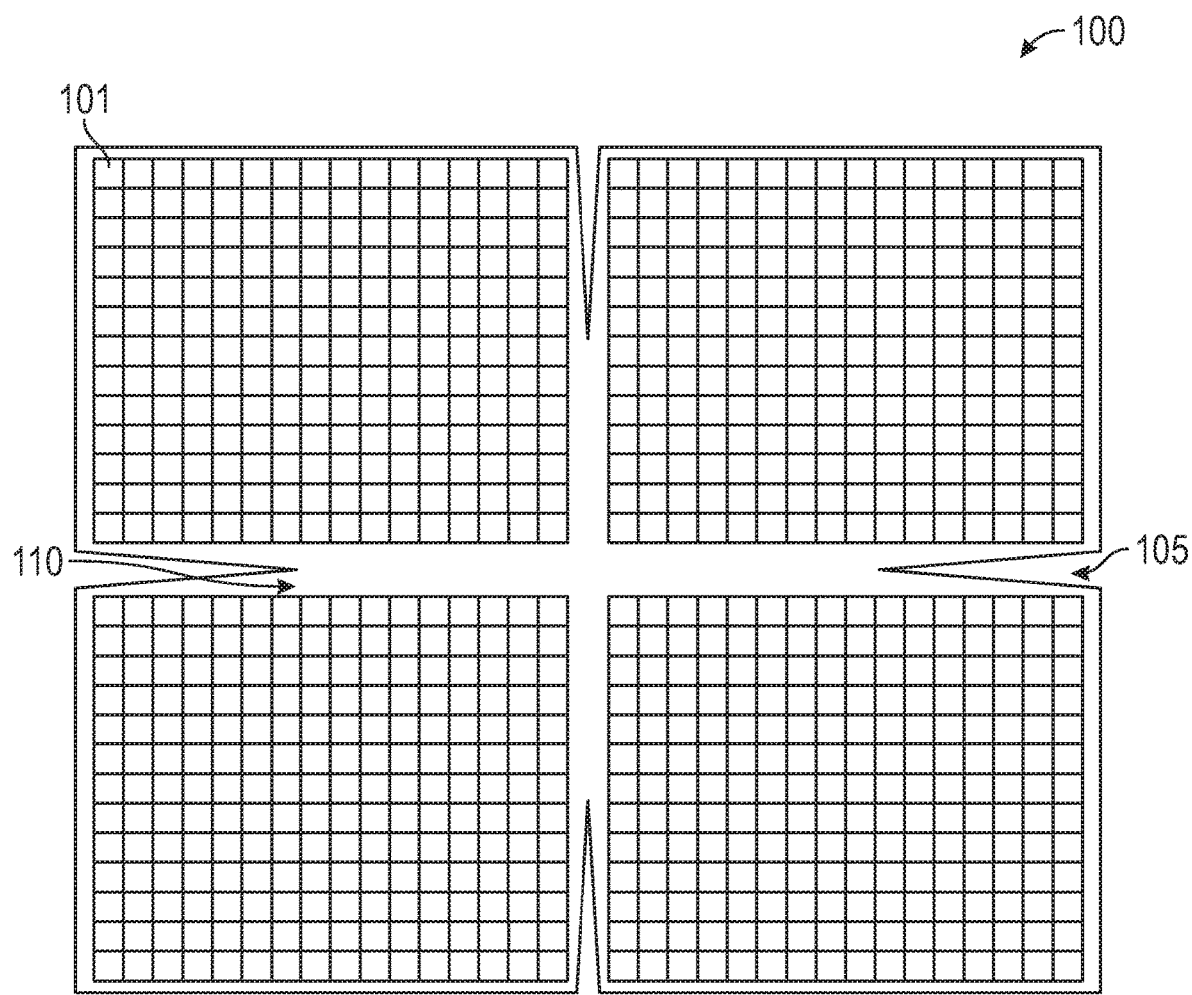
FIG. 1 is a schematic illustration of a hybrid focal-plane array according to an embodiment of the present invention.

Referring to FIG. 1, a hybrid focal-plane array (FPA) 100 is shown in a flat state. The hybrid focal-plane array 100 includes a detector die on which a plurality of pixels (e.g., light-sensing pixels) 101 are formed. The hybrid focal-plane array 100 is shown as having a rectangular shape, but the present disclosure is not limited thereto.

Under the detector die, a read-out integrated circuit (ROIC) is provided to provide an electrical connection between the pixels 101 and a package, such as a ceramic leadless chip carrier (CLCC) or plastic-leaded chip carrier (PLCC), on which the hybrid focal-plane array 100 is arranged.

To better facilitate curving (e.g., spherical curving or partial spherical curving) the hybrid focal-plane array 100, one or more slits 105 are provided in the detector die and the ROIC. For example, the slits 105 extend through both the detector die and the ROIC. The slits 105 in the detector die and the ROIC may be aligned with each other (e.g., may overlap each other in a top-down view). By including the slit(s) 105, the hybrid focal-plane array 100 may be curved to a greater degree than related art focal-plane arrays and a gap between adjacent pixels 101 in the curved state may be reduced or eliminated. Because the slit(s) 105 also extend through the ROIC, the hybrid focal-plane array 100 may be more easily curved and may be more easily held in the curved state by reducing the residual tension in the detector die and the ROIC after curving than a related art focal-plane array.

The pixels 101 may be arranged into groups on the detector die. For example, in the hybrid focal-plane array 100 shown in FIG. 1, shown as a rectangle as one example, the pixels 101 are arranged into four groups (e.g., four quadrants) and are spaced from each other by open area(s) 110 adjacent the slits 105. For example, the open area(s) 110 of the hybrid focal-plane array 100 may be areas of the detector die on which no pixels 101 are formed (or arranged) and may be areas of the hybrid focal-plane array 100 that are curved during the curving process.

Referring to FIGS. 2A-2E, schematic acts (steps) of manufacturing a ROIC are shown. The ROIC may include or may be formed of silicon. For example, the ROIC may start as a silicon-on-insulator (SOI) wafer 200.

Figure 2A:
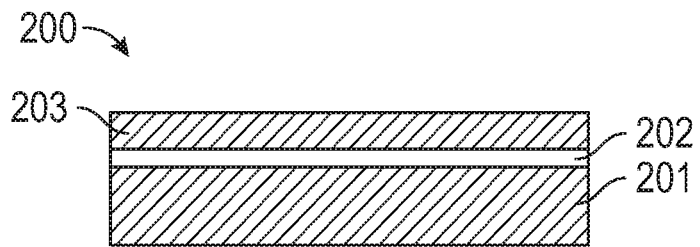
FIGS. 2A-2E show schematic acts (steps) of manufacturing a read-out integrated circuit (ROIC)

Referring to FIG. 2A, the silicon-on-insulator (SOI) wafer 200 including a bulk wafer (e.g., a wafer substrate) 201, an insulation layer 202, and a device layer (e.g., an electronic layer) 203 is provided. In some embodiments, a four-inch SOI wafer may be used. The bulk wafer 201 and the device layer 203 include or are formed of silicon (Si), and the insulation layer 202 includes or is formed of silicon dioxide (SiO$_2$), but the present disclosure is not limited thereto. The device layer 203 may have a thickness in a range of about 5 μm to about 25 μm, but the present disclosure is not limited thereto.

Figure 2B:
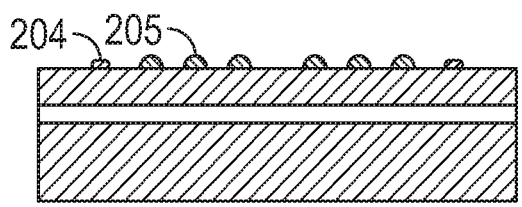

Referring to FIG. 2B, metal traces 204 and bumps (e.g., solder bumps) 205 are formed on an upper surface of the device layer 203. In some embodiments, the metal traces 204 may be omitted. For example, the metal traces 204 may be used for test and evaluation but may not be present in finalized designs. The metal traces 204 and the bumps 205 may include (or may be formed of) a conductive metal. For example, the metal traces may be formed of gold (Au), and the solder bumps 205 may be formed of indium (In). The metal traces 204 and the bumps 205 may be used in a flip-chip bonding process for joining (e.g., hybridizing) the ROIC and the detector die to each other, further described below, and may be formed by, for example, a deposition process, such as a Physical Vapor Deposition (PVD) process and/or a Chemical Vapor Deposition (CVD)).

Figure 2C:
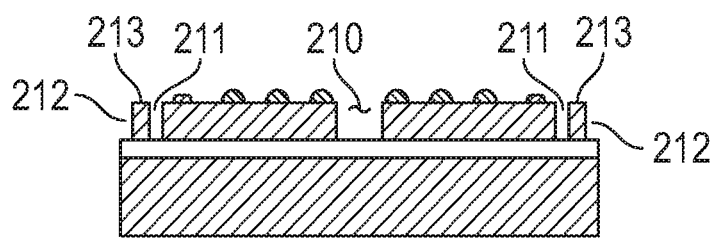

Referring to FIG. 2C, a ROIC slit pattern 210/211/212 is formed in the device layer 203. The ROIC slit pattern 210/211/212 may extend entirely through the device layer 203, or a relatively small portion of the device layer 203 may remain at a bottom of the slits of the ROIC slit pattern 210/211/212. The ROIC slit pattern 210/211/212 may be formed by a deep reactive-ion etch (DRIE) process. For example, when the device layer 203 includes or is formed of silicon, an etchant, such as nitric acid (HNO$_3$)+hydrofluoric acid (HF), Potassium hydroxide (KOH), Ethylenediamine pyrocatechol (EDP), and/or Tetramethylammonium hydroxide (TMAH), may be used to etch the device layer 203.

The ROIC slit pattern 210/211/212 may include a plurality of slits, including a ROIC bending slit (e.g., a first slit) 210 and dicing streets 211 and may also form die edges (e.g., device layer edges) 212. As will be further described below, the ROIC bending slit 210 may correspond to the slit 105 shown in FIG. 1. Further, although only a single ROIC bending slit 210 is shown in FIG. 2, a plurality of ROIC bending slits 210 may be formed, as shown in FIG. 1. In addition, the dicing streets 211 may extend around a periphery of the device layer 203 on which the metal traces 204 and the bumps 205 are formed in a rectangular or square shape. Further, the dicing streets 211 may form protective border portions 213 around the periphery of the device layer 203 on which the metal traces 204 and the bumps 205 are formed. The protective border portions 213 protect the edges of the device layer 203 during the manufacturing process and may be later removed as further described below.

Figure 2D:
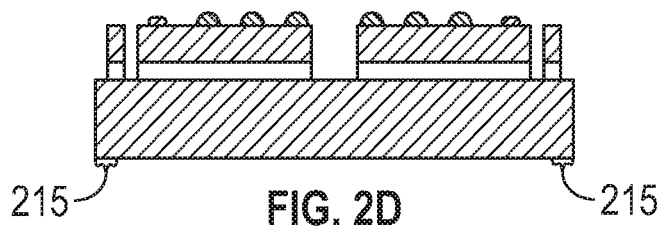

Referring to FIG. 2D, the insulation layer 202 in the ROIC bending slit 210, the dicing streets 211, and the die edges 212 may be removed (or substantially removed) by, for example, another etching process, such as another deep reactive-ion etching process. For example, when the insulating layer 202 includes or is formed of silicon dioxide, an etchant, such as Hydrofluoric acid (HF) and/or Buffered oxide etch [BOE]: ammonium fluoride (NH$_4$F) and hydrofluoric acid (HF), may be used to etch the insulating layer 202. The insulating layer 202 in the slit pattern 210/211/212 may be completely removed or a relatively small amount of the insulating layer 202 may remain after the etching.

Figure 2E:
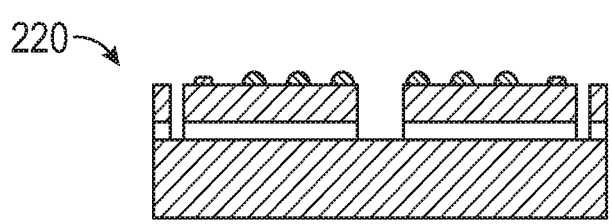

Referring to FIG. 2E, the excess bulk wafer 215 under the die edges 212 may be removed by, for example, saw cutting to provide a ROIC 220. For example, when a plurality of ROICs 220 are formed on a single SOI wafer 200, the saw cutting of the bulk wafer 201 under the die edges 212 may separate the ROICs 220 from each other for use in subsequent steps, as further described below.

By using deep reactive-ion etching to form the dicing streets 211, the edges of the device layer 203 and the insulation layer 202 are relatively clean and substantially defect free. For example, as one related art example, saw cutting or other methods of physical separation may be used to cut through the device layer 203, the insulating layer 202, and the bulk wafer 201 to form the edges. Saw cutting, however, introduces defects into the edges of the cut layers, and these defects may propagate through the cut layers over time and when the ROIC is curved. By using deep reactive-ion etching to form the edges of the device layer 203 and the insulation layer 202, these edges may be substantial defect free, thereby improving the curving performance of the ROIC 220 by reducing the number and extent of any defects therein.

Figure 3A:
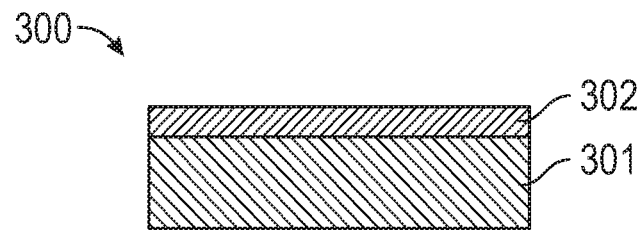
FIGS. 3A-3D show schematic acts (steps) of manufacturing a detector die.

FIGS. 3A-3D show schematic acts (steps) of manufacturing a detector die, such as an optical sensor or an imaging sensor. The detector die may be, for example, a strained-layer superlattice (SLS) infrared (IR) detector. Referring to FIG. 3A, a detector wafer 300 may include a detector substrate (e.g., a detector handle) 301 and a detector layer 302 on the detector substrate 301. The detector layer 302 may be an epitaxially-grown layer (e.g., an EPI layer) and may include, for example, a member of the III-V or II-VI semiconductor families, such as indium arsenide (InAs), gallium antimonide (GaSb), indium antimonide (InSb), indium gallium arsenide (InGaAs), etc. However, the present disclosure is not limited thereto. The detector layer 302 may have a thickness of about 5 μm, and the detector substrate 301 may have a thickness of about 500 μm. The present disclosure, however, is not limited thereto.

The detector substrate 301 may include, for example, Indium Phosphide (InP), but the present disclosure is not limited thereto.

Figure 3B:
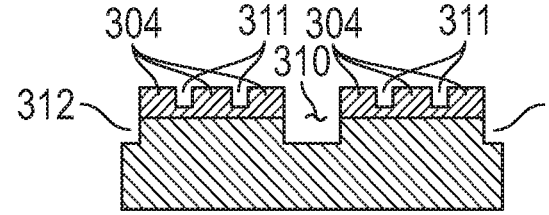

Referring to FIG. 3B, a detector slit pattern 310/311/312 is formed in the detector wafer 300. The detector slit pattern 310/311/312 may be formed by an inductively coupled plasma dry etching process. The detector slit pattern 310/311/312 may include a detector bending slit (e.g., a second slit) 310, pixel definition slits 311, and wafer edges 312. Although only a single detector bending slit 310 is shown, a plurality of detector bending slits 310 may be formed. For example, the number of detector bending slits 310 formed in the detector layer 302 may correspond to (e.g., may be the same as) the number of ROIC bending slits 210 formed in the device layer 203 of the ROIC 220.

The pixel definition slits 311 do not extend completely through the detector layer 302 (e.g., the pixel definition slits 311 have a depth that is less than the thickness of the detector layer 302) to form a plurality of pixel mesas 304 in the detector layer 302. The pixel definition slits 311 may be referred to as pixel grating. The detector bending slit 310 and the wafer edges 312, however, do extend through the detector layer 302 and also extend into (e.g., extend partially into) the detector substrate 301.

The detector bending slit 310, the pixel definition slits 311, and the wafer edges 312 may be concurrently (or simultaneously) formed. For example, the detector bending slit 310, the pixel definition slits 311, and the wafer edges 312 may be formed during a single process, such as a single inductively coupled plasma dry etching process. The widths of the detector bending slit 310, the pixel definition slits 311, and the wafer edges 312 are controlled to determine the final depths of these slits during the etching process, also referred to as the loading effect. For example, the width of the detector bending slit 310 is greater than the widths of each of the pixel definition slits 311 such that, after the etching process, the detector bending slit 310 is deeper than the pixel definition slits 311. By this method, a single etching process can provide slits having different depths, with the pixel definition slits 311 not extending through the detector layer 302 and the detector bending slit 310 extending through the detector layer 302 and into the detector substrate 301. Because the wafer edges 312 are formed at an outer edge of the detector wafer 300, they also etch faster than the detector bending slit 310 and the pixel definition slits 311, such that the wafer edges 312 extend through the detector layer 302 and into the detector substrate 301 even though they may not be as thick as the detector bending slit 310.

Figure 3C:
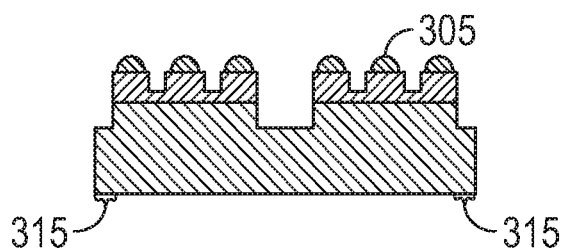

Referring to FIG. 3C, bumps (e.g., solder bumps) 305 are formed on the pixel mesas 304. In some embodiments, a bump 305 may be formed on each of the pixel mesas 304, but the present disclosure is not limited thereto. The bumps 305 may be similar to or the same as the bumps 205 described above with reference to FIG. 2B. For example, the bumps 305 may include (or may be formed of) indium (In) and may be formed by a deposition process.

Figure 3D:
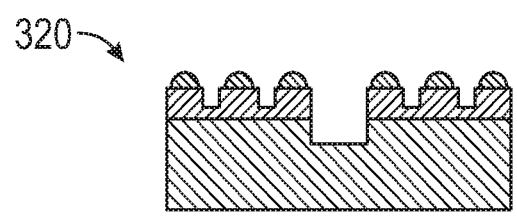

Referring to FIG. 3D, the excess detector substrate 315 under the wafer edges 312 is removed by, for example, saw cutting to provide a detector die 320. Similar to the saw cutting process described above with reference to FIG. 2E, the saw cutting may be used to separate a plurality of detector dies 320 formed on a single detector wafer 300 from each other. And, although the saw cutting may form defects in the detector substrate 301, the wafer edges 312 of the detector layer 302 are relatively clean and substantially defect free because they are formed by etching rather than by being mechanically cut or separated, thereby improving the curving performance of the detector layer 302 by reducing the number and/or size of defects in the detector layer 302.

FIGS. 4A-4D show schematic acts (steps) of joining (e.g., hybridizing) the ROIC 220 and the detector die 320 to each other to form a hybrid focal-plane array 400.

Referring to FIG. 4A, the ROIC 220 as described above with reference to FIGS. 2A-2E and the detector die 320 as described above with reference to FIGS. 3A-3D are joined together to form the hybrid focal-plane array 400. For example, the ROIC 220 and the detector die 320 are aligned and bonded to each other at the bumps 205/305. The ROIC 220 and the detector die 320 may be bonded to each other by a flip-chip bonding method in which the bumps 205/305 are reflowed to become a single structure connecting the ROIC 220 and the detector die 320 to each other. Further, the ROIC 220 and the detector die 320 are aligned with each other such that the ROIC bending slit(s) 210 are aligned with the detector bending slit(s) 310 and such that the bumps 205/305 are aligned with each other. The process of joining the ROIC 220 and the detector die 320 to each other may be referred to as hybridizing. In some embodiments, the bumps 205 of the detector die are connected vertically to the ROIC. The ROIC is configured to individually read and process each pixel of the detector die 320.

Further, an adhesive 401 is filled (e.g., is under-filled) between the ROIC 220 and the detector die 320 to increase the bond therebetween. The adhesive 401 may be, for example, an epoxy, but the present disclosure is not limited thereto. The adhesive 401 may be filled between the ROIC 220 and the detector die 320 in the pixel definition slits 311 and in the bending slit(s) 210/310.

Referring to FIG. 4B, the detector substrate 301 of the detector die 320 is lapped and/or etched to be removed from the detector die 320. For example, the detector substrate 301 may first be mechanically thinned (e.g., lapped) and then etched by, for example, a dry plasma etch, to be removed (e.g., to be entirely removed) from the detector die 320. After the detector substrate 301 is removed from the detector die 320, a bottom surface of the detector layer 302 and the bending slit(s) 210/310 may be exposed at an upper surface of the hybrid focal-plane array 400. After the detector substrate 301 is removed, the adhesive 401 in the bending slit(s) 210/310 is exposed at the upper surface of the hybrid focal-plane array 400.

Referring to FIG. 4C, the adhesive 401 is removed from the bending slit(s) 210/310 by, for example, a plasma etching process. The plasma etching process may be, for example, a relatively high-power oxygen plasma etching process. The plasma etching process may only remove the adhesive 401 from the bending slit(s) 210/310, leaving the adhesive 401 elsewhere between the ROIC 220 and the detector die 320.

Referring to FIG. 4D, the ROIC 220 is lapped and/or etched to a thickness of about 100 μm. For example, the bulk wafer 201 of the ROIC 220 may be substantially thinned or completely removed from the ROIC 220 by first lapping the bulk wafer 201 and then etching the remaining bulk wafer 201, leaving the insulation layer 202 as the bottom-most layer of the hybrid focal-plane array 400. For example, when the bulk wafer 201 includes or is made of silicon, a plasma dry etching process may be used to etch the bulk wafer 201. After the bulk wafer 201 is removed, the overall thickness of the device layer 203 and the insulation layer 202 may be in a range of about 10 μm to about 25 μm. Further, by removing the bulk wafer 201, the protective border portions 213 of the ROIC 220 are removed without requiring any additional processing steps to remove the insulation layer 202 of the protective border portions 213. That is, because the protective border portions 213 are only connected to the ROIC 220 via the bulk wafer 201, completely removing the bulk wafer 201 also removes the protective border portions 213.

In some embodiments, the hybrid focal-plane array 400 is attached to a carrier wafer (not shown) to facilitate the lapping and/or etching the bulk wafer 201. For example, the detector layer 302 may be mounted to the carrier wafer so the bulk wafer 201 is exposed to be lapped and/or etched. In such an embodiment, after the bulk wafer 201 is removed from the hybrid focal-plane array 400, the hybrid focal-plane array 400 is soaked in acetone until the hybrid focal-plane array 400 separates from the carrier wafer.

The hybrid focal-plane array 400 may then be curved to have a three-dimensional spherical shape (or partial three-dimensional spherical shape). For example, the hybrid focal-plane array 400 may be curved to have a partial spherical shape, such as a concave shape. The hybrid focal-plane array 400 may be curved to a greater degree than related art focal-plane arrays due at least to the substantially defect free edges thereof, the bending slit(s) extending therethrough, and the thin, uniform overall thickness thereof. The hybrid focal-plane array 400 may be curved to a greater degree than related art focal-plane arrays without wrinkling and/or without alignment issues between the pixels. Accordingly, the hybrid focal-plane array 400 may have a greater field of view and image quality by using a relatively simple lens design when compared with related art focal-plane arrays.

Certain components of imaging device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the imaging device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the terms "exemplary" and "example" are intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although example embodiments of a hybrid focal-plane array (FPA) and a method of manufacturing the same have been described and illustrated herein, many modifications and variations within those embodiments will be apparent to those skilled in the art. Accordingly, it is to be understood that a hybrid focal-plane array and a method of manufacturing the same according to the present disclosure may be embodied in forms other than as described herein without departing from the spirit and scope of the present disclosure. The present disclosure is defined by the following claims and equivalents thereof.

What is claimed is:

1. A method of manufacturing a hybrid focal-plane array, the method comprising:
   forming a read-out integrated circuit with integral bending slit;
   forming a detector die separately from the read-out integrated circuit and comprising a detector with integral bending slit; and
   joining the read-out integrated circuit and the detector die to each other such that the read-out bending slit and the detector bending slit are aligned with each other.

2. The method of claim 1, wherein the forming of the read-out integrated circuit comprises etching a read-out slit pattern into a device layer of a silicon-on-insulator wafer, the read-out slit pattern comprising the read-out bending slit.

3. The method of claim 2, wherein the etching of the read-out slit pattern comprises deep reactive-ion etching.

4. The method claim 2, wherein the forming of the read-out integrated circuit further comprises saw cutting a bulk wafer of the silicon-on-insulator wafer after the etching of the read-out slit pattern.

5. The method of claim 1, wherein the forming of the detector die comprises etching a detector slit pattern into a detector layer thereof, the detector slit pattern comprising the detector bending slit.

6. The method of claim 5, wherein the detector layer comprises an epitaxially-grown layer,
   wherein the detector slit pattern is formed in the epitaxially-grown layer, and
   wherein the detector bending slit of the detector slit pattern extends through the epitaxially-grown layer and a plurality of pixel definition slits of the detector slit pattern having a depth less than a thickness of the epitaxially-grown layer.

7. The method of claim 1, wherein the joining of the read-out integrated circuit and the detector die to each other comprises:
   aligning the read-out integrated circuit and the detector die with each other;
   adhered the read-out integrated circuit and the detector die to each other using a flip-chip bonding method; and
   under-filling a space between the read-out integrated circuit and the detector die with an adhesive.

8. The method of claim 7, further comprising:
   removing a detector substrate from the detector die after the joining of the read-out integrated circuit and the detector die to each other; and
   removing a bulk wafer from the read-out integrated circuit after the joining of the read-out integrated circuit and the detector die to each other.

9. The method of claim 8, wherein the removing of the detector substrate reveals the detector bending slit.

10. The method of claim 9, further comprising removing a portion of the adhesive in the read-out bending slit and the detector bending slit after the removing of the detector substrate.

11. A method of manufacturing a hybrid focal-plane array comprising a read-out integrated circuit and a detector die, the method comprising:
   forming the read-out integrated circuit, the forming of the read-out integrated circuit comprising forming a read-out bending slit extending through a device layer and an insulation layer of a silicon-on-insulator wafer;
   forming the detector die, the forming of the detector die comprising forming a detector bending slit extending through a detector layer and into a detector substrate;
   aligning the read-out integrated circuit and the detector die with each other such that the read-out bending slit and the detector bending slit are aligned with each other; and
   adhering the read-out integrated circuit and the detector die to each other.

12. The method of claim 11, wherein the forming of the read-out integrated circuit further comprises forming a plurality of bumps on the device layer; and
   wherein the forming of the detector die further comprises forming a plurality of bumps on the detector layer.

13. The method of claim 12, wherein the forming of the detector die further comprises forming a plurality of pixel definition slits in the detector layer, the pixel definition slits having a depth less than a thickness of the detector layer, and
   wherein the bumps on the detector layer are formed between adjacent ones of the pixel definition slits.

14. The method of claim 11, wherein the forming of the read-out integrated circuit further comprises etching an edge of the device layer; and
   wherein the forming of the detector die further comprises etching an edge of the detector layer.

15. The method of claim 14, wherein the forming of the read-out integrated circuit further comprises saw cutting an edge of a bulk wafer of the silicon-on-insulator wafer; and
   wherein the forming of the detector die further comprises saw cutting an edge of the detector substrate.

16. The method of claim 11, wherein, after the adhering of the read-out integrated circuit and the detector die to each other, the detector substrate is removed from the detector die.

17. The method of claim 16, wherein the read-out integrated circuit and the detector die are adhered to each other with an adhesive, and
   wherein, after the removal of the detector substrate from the detector die, an adhesive in the read-out bending slit and the detector bending slit is removed.

18. The method of claim 17, wherein, after the adhering of the read-out integrated circuit and the detector die to each other, a bulk wafer of the silicon-on-insulator wafer is removed.

19. The method of claim 18, wherein, after the removal of the detector substrate and the bulk wafer, the read-out bending slit and the detector bending slit form a continuous slit extending through the detector die and the read-out integrated circuit.

20. A hybrid focal-plane array comprising:
   a read-out integrated circuit comprising a device layer and having a read-out bending slit extending through the device layer; and
   a detector die comprising a detector layer and having a detector bending slit extending through the detector layer, the read-out integrated circuit and the detector die being adhered to each other such that the read-out bending slit and the detector bending slit are aligned with each other.

* * * * *